(12) United States Patent
Izumi et al.

(10) Patent No.: US 6,344,370 B1
(45) Date of Patent: Feb. 5, 2002

(54) METHOD FOR FABRICATING DETECTION ELEMENT AND METHOD FOR FABRICATING TWO-DIMENSIONAL IMAGE DETECTOR USING DETECTION ELEMENT

(75) Inventors: Yoshihiro Izumi, Kashihara; Osamu Teranuma, Tenri; Toshiyuki Sato, Kyoto; Satoshi Tokuda, Kusatsu; Toshinori Yoshimuta, Takatsuki, all of (JP)

(73) Assignees: Sharp Kabushiki Kaisha; Shimadzu Corporation, both of (JP)

( * ) Notice: Subject to any disclaimer, the term of this patent is extended or adjusted under 35 U.S.C. 154(b) by 0 days.

(21) Appl. No.: 09/543,673

(22) Filed: Apr. 6, 2000

(30) Foreign Application Priority Data

Apr. 19, 1999 (JP) .............................. 11-111216

(51) Int. Cl.[7] .............................................. H01L 21/00
(52) U.S. Cl. .............................. 438/97; 438/57; 438/73; 438/96
(58) Field of Search .............................. 438/57, 97, 73, 438/96

(56) References Cited

U.S. PATENT DOCUMENTS 4,394,749 A * 7/1983 Tsukada et al.
5,379,336 A    1/1995 Kramer et al.

FOREIGN PATENT DOCUMENTS

| EP | 0 523 783 A  | 1/1993  |
| EP | 0 602 475 A  | 6/1994  |
| EP | 0 783 177 A  | 7/1997  |
| JP | 6-342098 A   | 12/1994 |
| JP | 324098/1994  | 12/1994 |

OTHER PUBLICATIONS

Ohyama et al, "High Efficient Thin–Film Cds/CdTe Solar Cells", Matsushita Technical Journal, vol. 55, No. 4, Aug. 1998, pp. 477–480.

(List continued on next page.)

*Primary Examiner*—Long Pham
(74) *Attorney, Agent, or Firm*—Nixon & Vanderhye PC

(57) ABSTRACT

In a method of the present invention for fabricating a two-dimensional image detector in which a light/radiations detection element is applied, an upper electrode, a first charge blocking layer, and a semiconductor layer having photoconductivity are provided on support substrate in the stated order, and thereafter, a surface of the semiconductor layer is sprayed with ceramic particles by means of an abrasive grain jet nozzle. The abrasive grain jet nozzle repeatedly makes a high-speed reciprocating motion in an X direction at constant cycles while jetting the ceramic particles to the entirety of the surface of the semiconductor layer of the counter substrate moving in a Y direction, so that the surface of the semiconductor layer is subjected to a flattening treatment. This enables to provide a two-dimensional image detector in which a light/radiations detection element that provides effective improvement of a charge blocking effect and suppression of deterioration of reliability is applied.

31 Claims, 8 Drawing Sheets

OTHER PUBLICATIONS

Baba, "CdTe Radiation Detectors and their Recent Development", Applied Physics, vol. 65, No. 10, 1996, pp. 1047–1051.

USSN 09/229,269, filed Jan. 13, 1999, entitled "Two-Dimensional Image Detector and Process for Manufacturing the Same".

USSN 09/239,855, filed Jan. 29, 1999, entitled " Two-Dimensional Image Detecting Device and Manufacturing Method Thereof".

Lee et al, "A New Digital Detector for Projection Radiography", 1995, SPIE, vol. 2432, pp. 237–249.

Jeromine et al, "Application of a–Si Active Matrix Technology in a X–Ray Detector Panel", SID 97 Digest, May 13–15, 1997, pp. 91–94.

U.S. application No. 09/229,269, Izumi et al., filed Jan. 13, 1999.

U.S. application No. 09/239,855, Teranuma et al., filed Jan. 29, 1999.

"High Efficient Thin–Film CdS/CdTe Solar Cells" (H. Ohyama et al., Matsushita Technical Journal vol. 44 No. 4 pp. 477–480, Aug. 1998).

"A New Digital Detector for Projection Radiography", Lee et al, 1995, SPIE, vol. 2432, pp. 237–249.

"Application of a–Si Active Matrix Technology in a X–Ray Detector Panel", Jeromine et al, SID 97 Digest, May 13–15, 1997, pp. 91–94.

* cited by examiner

20μm

METHOD FOR FABRICATING DETECTION ELEMENT AND METHOD FOR FABRICATING TWO-DIMENSIONAL IMAGE DETECTOR USING DETECTION ELEMENT

FIELD OF THE INVENTION

The present invention relates to a method for fabricating a detection element for detecting light or radiations in which a semiconductor film is used, and a method for fabricating a two-dimensional image detector using the detection element.

BACKGROUND OF THE INVENTION

Conventionally known as a radiation-sensitive two-dimensional image detector for detecting images by means of radiations has been an apparatus composed of semiconductor sensors (detection elements for detecting radiations) arranged in two dimension that generate charges (electron-hole) upon detection of X-rays. Each semiconductor sensor is provided with an electric switch, and the electric switches are consecutively turned on line by line so that charges in each semiconductor sensor are read out line by line. The Japanese Publication for Laid-Open Patent Application 342098/1994 (Tokukaihei 6-342098 [Publication Date: Dec. 13, 1994]), for example, describes concrete structure and principles of such a radiation-sensitive two-dimensional image detector.

The following description will explain the structure and principles of the foregoing conventional two-dimensional image detector. FIG. 6 is a view schematically illustrating a structure of the foregoing conventional radiation-sensitive two-dimensional image detector. FIG. 7 is a cross-sectional view schematically illustrating a structure of a part of the foregoing radiation-sensitive two-dimensional image detector corresponding to one pixel.

The conventional radiation-sensitive two-dimensional image detector is composed of an active matrix substrate, as well as a photoconductive layer (semiconductor layer) 56, a dielectric layer 57, and an upper electrode 58 that are formed over a substantial entirety of the active matrix substrate. The active matrix substrate includes electrode wires (gate electrodes 52 and data electrodes 53) arranged in an XY lattice form, thin film transistors (hereinafter referred to as TFTs) 54, charge storing capacitors (Cs) 55, and the like provided on a glass substrate 51.

To form the foregoing photoconductive layer 56, a semiconductor material is used in which charges (electron-hole) are generated upon irradiation by radiations such as X-rays. In the foregoing document, as the semiconductor material, amorphous selenium (a-Se) is used that has a high dark resistance and excels in photoconductivity with respect to X-rays. The photoconductive layer 56 is formed to a thickness of 300 μm to 600 μm by the vapor deposition method.

Besides, as the foregoing active matrix substrate, an active matrix substrate formed in a liquid crystal display device fabricating process may be adopted. For example, an active matrix substrate used in an active-matrix-type liquid crystal display device (AMLCD) is arranged to include TFTs made of amorphous silicon (a-Si) or polysilicon (p-Si), electrodes arranged in an XY lattice form, and charge storing capacitors (Cs). Therefore, the AMLCD can be easily used, with slight changes in the design, as the active matrix substrate for use in the radiation-sensitive two-dimensional image detector.

Next, the operational principles of a radiation-sensitive two-dimensional image detector having the foregoing structure are explained below. Upon projection of radiations onto the photoconductive layer 56 composed of an a-Se film or the like, charges (electron-hole) are generated in the photoconductive layer 56. As shown in FIGS. 6 and 7, since the photoconductive layer 56 and the charge storing capacitors (Cs) 55 are connected electrically in series, charges (electron-hole) generated in the photoconductive layer 56 move to the plus electrode side and the minus electrode side upon application of a voltage across the upper electrode 58 and charge storing capacitor electrodes (Cs electrodes) 59. Consequently, charges are stored in the charge storing capacitors (Cs) 55. Each charge storing capacitor (Cs) 55 is equipped with the charge storing capacitor electrode (Cs electrode) 59 and a pixel electrode 60.

By the foregoing operation, the charges stored in the charge storing capacitors (Cs) 55 can be taken to outside through the data electrodes $S_1, S_2, S_3, \ldots S_n$ by turning on the TFTs 54 by using input signals to the gate electrodes $G_1, G_2, G_3, \ldots, G_n$. Since electrode wires (gate electrodes 52 and data electrodes 53), TFT 54, and charge storing capacitors (Cs) 55 are all arranged in an XY matrix form, image information on the X lines can be two-dimensionally obtained by line-sequentially scanning signals inputted to the gate electrodes $G_1, G_2, G_3, \ldots, G_n$.

Incidentally, in the case where the photosensitive layer 56 used in the foregoing radiation-sensitive two-dimensional image detector exhibits photoconductivity with respect to not only radiations such as X-rays but also visible light and infrared light, it functions also as a two-dimensional image detector for visible light and infrared light.

In the foregoing conventional two-dimensional image detector, the a-Se film used in the photoconductive layer is directly formed on the active matrix substrate by the vapor deposition method. In the case of such a structure, the following problems arise.

(1) In the case where another semiconductor material is used instead of a-Se to form the photoconductive layer, the semiconductor materials applicable are limited according to the thermal resistivity of the active matrix substrate. For example, a polycrystalline film of CdTe or CdZnTe that expectedly provides improvement of sensitivity with respect to X-rays requires a film forming temperature of not lower than 400° C. in the case where it is formed by the MOCVD (metal organic chemical vapor deposition) method, the close-spaced sublimation method, the paste burning method, or the like that is suitable for forming a film on a large-area surface.

On the other hand, a-Si formed in a film form at a temperature of approximately 300° C. is generally used in semiconductor layers of TFTs used as switching elements provided on an active matrix substrate. For this reason, a critical temperature of the TFTs regarding heat resistance (hereinafter referred to as heat resistance critical temperature) is approximately 300° C. Therefore, it is difficult to form a film of a polycrystalline material such as CdTe or CdZnTe directly on the active matrix substrate.

(2) Generally, the active matrix substrate is fabricated by repeated application of a micromachining process (photolithography) to semiconductors, and naturally the yield thereof decreases as the fabrication process is prolonged. In the case where a charge blocking layer, a photoconductive layer, and an upper electrode are further additionally formed on such an active matrix substrate, the following problem arises: a failure occurring during this addition-type process leads to a drastic fall of the yield in total.

Therefore, applicable to solve the foregoing two problems is a method in which an active matrix substrate and a counter substrate (detection element for detecting light or radiations) including a photoconductive layer are formed separately and independently, and are thereafter assembled so as to be connected with each other by using a conductive connection material. This ensures that the limitation relating to the film formation temperature of the semiconductor layer as the photoconductive layer is relaxed, and that the decrease in the yield can be avoided by combining a non-defective active matrix substrate and a non-defective counter substrate.

Incidentally, by using either anisotropic conductive material or a conductive material arranged in a pattern corresponding to pixels provided separately and independently from one another, a plurality of pixels provided on an active matrix substrate obtain conductivity with a connection surface only in the normal line direction. This enables prevention of electric crosstalk between adjacent pixels within the connection surface.

Appropriately adapted as the anisotropic conductive material is an insulating adhesive (binder resin) in which conductive particles are dispersed, that is, a so-called anisotropic conductive adhesive. Applicable as conductive particles used in the anisotropic conductive adhesive are metal particles such as Ni (nickel) particles, metal particles obtained by plating Ni particles with Au (gold), carbon particles, metal-coated plastic particles such as Au/Ni-plated plastic particles, conductive particle composite plastic obtained by mixing in polyurethane transparent conductive particles such as ITO particles as well as Ni particles, etc. Examples of an adhesive applicable in the foregoing anisotropic conductive adhesive include those of a heat-hardening type, photo-hardening type, and thermoplastic type.

On the other hand, appropriately adapted as the conductive material arranged in the pattern according to pixels separately provided from each other is, for example, (i) a photosensitive resin with a conductivity imparted thereto that can be patterned so as to be provided only on pixel electrodes by the photolithography technique, (ii) a conductive adhesive that can be patterned so as to be provided only on pixel electrodes by the screen printing technique, or (iii) solder bumps.

However, as described above, problems described below arise in the case where an active matrix substrate and a counter substrate including a semiconductor layer with photoconductivity are separately formed and are then assembled so as to be connected with each other by using a conductive connection material, to form a two-dimensional image detector.

FIG. 8 is a cross-sectional view schematically illustrating a structure of a part of a two-dimensional image detector corresponding to one pixel. The two-dimensional image detector is formed in the following manner: an active matrix substrate 61 and a counter substrate (detection element for detecting light or radiations) including a semiconductor layer 66 having photoconductivity, having been separately formed, are assembled with a conductive adhesive 69 arranged in a pattern according to pixels that are separately provided from each other.

In the foregoing two-dimensional image detector, the counter substrate 62 including the semiconductor layer 66 is formed by laminating an upper electrode 64, a first charge blocking layer 65 as required, a semiconductor layer 66 having photoconductivity, a second charge blocking layer 67 as required, and a connection electrode 68 in this order on over a substantial entirety of a surface of a support substrate 63.

Since the first and second charge blocking layers 65 and 67 among them are intended to reduce dark current (current leakage) of the semiconductor layer 66, they may be provided as required. The foregoing connection electrode 68 is aimed for collecting charges at each pixel.

In the case where the aforementioned polycrystalline semiconductor material such as CdTe or CdZnTe is used for forming the foregoing semiconductor layer 66, the semiconductor layer 66 need be formed to a film thickness (layer thickness) of several hundreds of $\mu$m, in consideration of the efficiency in absorbing X-rays. However, it has been discovered that, in the case where polycrystalline CdTe is formed to a thickness of several hundreds of $\mu$m, random projections and recesses are produced on the surface. This phenomenon is observed also in the case where CdTe or CdZnTe is provided in a film form by any method such as the MOCVD method, the close-spaced sublimation method, or the paste burning method.

The following three problems (a) through (c) arise in the case where projections and recesses are produced on the surface of the semiconductor layer 66 as described above.

(a) A desirable junction state cannot be obtained at the interface between the semiconductor layer 66 and the second charge blocking layer 67, resulting in that a sufficient charge blocking effect cannot be obtained. More specifically, when to obtain a charge blocking effect is attempted by junction of the semiconductor layer 66 to the second charge blocking layer 67 (by, for example, the PIN junction, or the Schottky junction, the MIS (metal insulator semiconductor) junction, or the hetero junction), a problem that the second charge blocking layer 67 is not formed in a good state arises, and a sufficient charge blocking effect cannot be achieved. The reason is as follows: since the second charge blocking layer 67 is formed on the surface of the semiconductor layer 66 having projections and recesses, the second charge blocking layer 67 is not adequately formed on, for example, top parts of projections of the semiconductor layer 66, and leakage occurs there.

(b) Upon assembly of the active matrix substrate 61 and the counter substrate 62, projections and recesses are also produced on the connection electrode 68 on the surface of the counter substrate 62 according to the projections and recesses on the surface of the semiconductor layer 66, thereby causing defects in contact between the connection electrode 68 and the conductive connection material 69.

For example, in the case where an anisotropic conductive adhesive is used as the conductive connection material 69, conductive particles are buried in recesses of the connection electrode 68, and hence, cannot be sufficiently flatly dispersed. This causes connection defects to likely occur and reliability to deteriorate.

Furthermore, in the case where a conductive material (for example, photoconductive resin) patterned according to pixels is used as the conductive connection material 69, bubbles tend to be caught between the connection electrode 68 and the conductive connection material 69, thereby likely leading to deterioration of reliability. Furthermore, the conductive connection material 69 need be patterned according to pixels independent and separate from one another, but the pattern form of the conductive connection material 69 tends to vary due to influences of the projections and recesses on the surface of the connection electrode 68, thereby resulting in that portions of the conductive connection material 69 corresponding to adjacent pixels are likely brought into contact with each other.

(c) In the case where the connection electrode 68 that collects charges is provided on the second charge blocking layer 67 on the semiconductor layer 66, or on the semiconductor layer 66 (without the second charge blocking layer 67), it is difficult to conduct micromachining of the connection electrode 68 if the surface of the semiconductor layer 66 has projections and recesses.

Furthermore, a polycrystalline film of CdTe or CdZnTe can be also used in a device other than the two-dimensional image detector, for instance, a solar battery that is a sort of a detection element for detecting light. An example of a CdS/CdTe thin film solar battery is reported in Matsushita Technical Journal, Vol.44, No.4, pp.477–488 (1998).

To briefly explain a fabrication process of the foregoing CdS/CdTe thin film solar battery, a CdTe polycrystalline thin film whose crystalline particle diameter is about 3 $\mu$m is formed about 6 $\mu$m in thickness. Furthermore, after the crystalline particle diameter of CdTe is caused to grow by thermal treatment to about 5 $\mu$m, a conductive paste of carbon or the like is applied by printing on the CdTe film to form an upper electrode. Thus, a solar battery is completed.

Here, projections and recesses that have a difference in height of about 3 $\mu$m (±1.5 $\mu$m) are likely produced on the surface of the CdTe film, reflecting shapes of the crystalline particles with the diameter of about 5 $\mu$m. Therefore, in printing the conductive paste thereon, failures in printing tend to occur due to the projections and recesses on the surface.

SUMMARY OF THE INVENTION

An object of the present invention is to provide a method for fabricating a detection element for detecting light or radiations in which effective improvement of a charge blocking effect and improvement of reliability can be achieved by flattening a surface of a semiconductor film having projections and recesses, and further, to provide a method for fabricating a two-dimensional image detector in which the foregoing detection element for detecting light or radiations is applied.

To achieve the foregoing object, a method for fabricating a detection element in accordance with the present invention is characterized by including the steps of (i) forming a semiconductor film having photoconductivity on a substrate, (ii) flattening a surface of the semiconductor film, and (iii) forming at least either a charge blocking layer or an electrode layer on the semiconductor film.

Furthermore, preferably used as the foregoing semiconductor film is a semiconductor film that exhibits photoconductivity with respect to at least either visual light or infrared light projected thereto, or alternatively, a semiconductor film exhibiting photoconductivity with respect to radiations projected thereto.

According to the foregoing method, the semiconductor film is formed on the substrate, a surface of the semiconductor film is then flattened, and thereafter, at least either a charge blocking layer or an electrode layer is formed on the semiconductor film. Therefore, when at least either a charge blocking layer or an electrode layer is formed on the semiconductor film, the semiconductor film has a surface that is flat, having substantially no projections or recesses.

This enables to obtain an ideal connection state at an interface between the semiconductor film and the charge blocking layer in the case where the charge blocking layer is formed on the semiconductor film. Therefore, this enables to suppress occurrence of leakage at the interface between the semiconductor film and the charge blocking layer, thereby ensuring an effective charge blocking effect. Further, in the case where the charge blocking layer or the electrode layer is formed on the semiconductor film, the micromachining process can be easily applied for forming the charge blocking layer or the electrode layer since the surface of the semiconductor film is flattened.

Furthermore, the method for fabricating a detection element in accordance with the present invention is preferably arranged so that in the flattening step, the surface of the semiconductor film is sprayed with ceramic particles.

Usually, the method of spraying a substrate as a work with ceramic particles is applied for the purpose of arbitrarily producing random projections and recesses on a surface of the substrate. Therefore, by the foregoing method in which the semiconductor film having projections and recesses on its surface is sprayed with ceramic particles, conversely the flatness of the semiconductor film surface can be improved. Since such a ceramic particle spraying method is very simple, it is possible to realize flatness of the semiconductor film surface by means of a simple device.

Thus, it is possible to easily make a semiconductor film formed on a large-area substrate possess a flat surface.

Incidentally, the "ceramic particles" described herein generally refer to particles made of a solid substance other than a metal.

A method for fabricating a two-dimensional image detector in accordance with the present invention is a method for fabrication a two-dimensional image detector composed of (1) an active matrix substrate having (i) a pixel array layer including electrode wires arranged in a lattice form, (ii) switching elements provided at lattice points of the electrode wires, and (iii) charge storing capacitors including pixel electrodes connected with the electrode wires through the switching elements, (2) a counter substrate having a support substrate on which a first electrode layer and a semiconductor film having photoconductivity are provided in the stated order, and (3) a conductive connection material electrically connecting the active matrix substrate and the counter substrate in a state in which the pixel array layer of the active matrix substrate and the semiconductor film of the counter substrate are vis-a-vis each other, and the method is characterized by including the steps of (a) forming the first electrode layer on the support substrate, (b) forming the semiconductor layer on the first electrode layer, (c) flattening a surface of the semiconductor film, and (d) forming either a charge blocking layer or a second electrode layer on the semiconductor film.

According to the foregoing method, an active matrix substrate provided with a pixel array layer and a counter substrate having a semiconductor film with photoconductivity are separately fabricated, and thereafter, these substrates are electrically connected with a conductive connection material. On the other hand, the counter substrate is fabricated as follows: a first electrode layer and a semiconductor film are formed in this order on a support substrate, a surface of the semiconductor film is then flattened, and thereafter, either a charge blocking layer or a second electrode layer are formed thereon. Therefore, when the charge blocking layer or the second electrode layer is formed on the semiconductor film, the semiconductor film surface is flat, having substantially no projections or recesses.

This enables to obtain an ideal connection state at an interface between the semiconductor film and the charge blocking layer in the case where the charge blocking layer is formed on the semiconductor film. Therefore, this enables suppression of occurrence of leakage at the interface between the semiconductor film and the charge blocking layer, thereby ensuring an effective charge blocking effect.

Further, in the case where the charge blocking layer or the second electrode layer functioning to collect charges is formed on the semiconductor film, the micromachining process can be easily applied for forming the charge blocking layer or the second electrode layer since the surface of the semiconductor film is flattened.

Furthermore, the method for fabricating a two-dimensional image detector in accordance with the present invention is preferably arranged so that in the flattening step, the surface of the semiconductor film is sprayed with ceramic particles.

Usually, the method of spraying a substrate as a work with ceramic particles is applied for the purpose of arbitrarily producing random projections and recesses on a surface of the substrate. Therefore, by the foregoing method in which the semiconductor film having projections and recesses on its surface is sprayed with ceramic particles, conversely the flatness of the semiconductor film surface can be improved. Since such a ceramic particle spraying method is very simple, it is possible to realize flatness of the semiconductor film surface composing the two-dimensional image detector by means of a simple device.

Thus, it is possible to easily make a semiconductor film in the two-dimensional image detector possess a flat surface even in the case where it is formed on a large-area support substrate.

Incidentally, the "ceramic particles" described herein generally refer to particles made of a solid substance other than a metal.

For a fuller understanding of the nature and advantages of the invention, reference should be made to the ensuing detailed description taken in conjunction with the accompanying drawings.

DESCRIPTION OF THE PREFERRED EMBODIMENTS

The following description will explain a first embodiment of the present invention, while referring to FIGS. 1 through 4.

Figure 1:
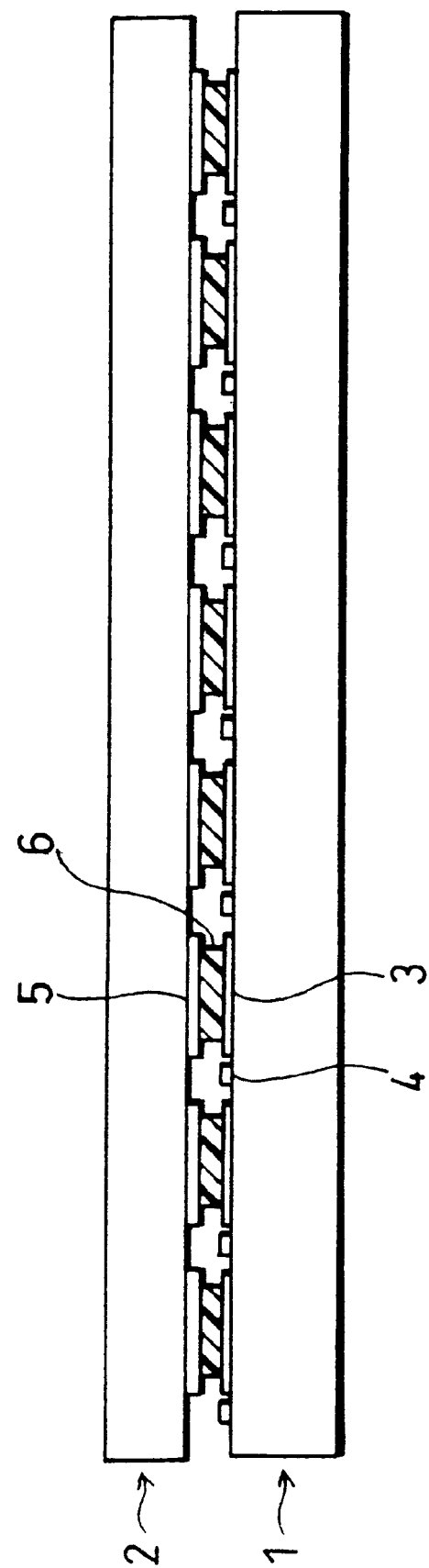
FIG. 1 is a cross-sectional view illustrating an arrangement of a two-dimensional image detector in accordance with a first embodiment of the present invention.

FIG. 1 is a cross-sectional view illustrating an arrangement of a two-dimensional image detector fabricated by a two-dimensional image detector fabricating method in accordance with the present embodiment. Note that a driving circuit and a data reading circuit to be attached outside are omitted in the drawing.

An entire area of the two-dimensional image detector is 40 cm×50 cm in which pixels are arrayed in matrix at pitches of 150 μm. The pixel electrodes 3 composing charge storing capacitors described later, the TFTs 4 as switching elements, and electrode wires (not shown) arranged in a lattice form are provided on the active matrix substrate 1.

An upper electrode (not shown), a first charge blocking layer (not shown) provided when necessary, a semiconductor layer having photoconductivity (semiconductor film) (not shown), a second charge blocking layer (not shown) provided when necessary, connection electrodes 5, etc. are formed on the counter substrate 2.

The two-dimensional image detector in accordance with the present embodiment is composed of the foregoing active matrix substrate 1 and the foregoing counter substrate 2 by connecting the two electrically and mechanically.

Figure 2:
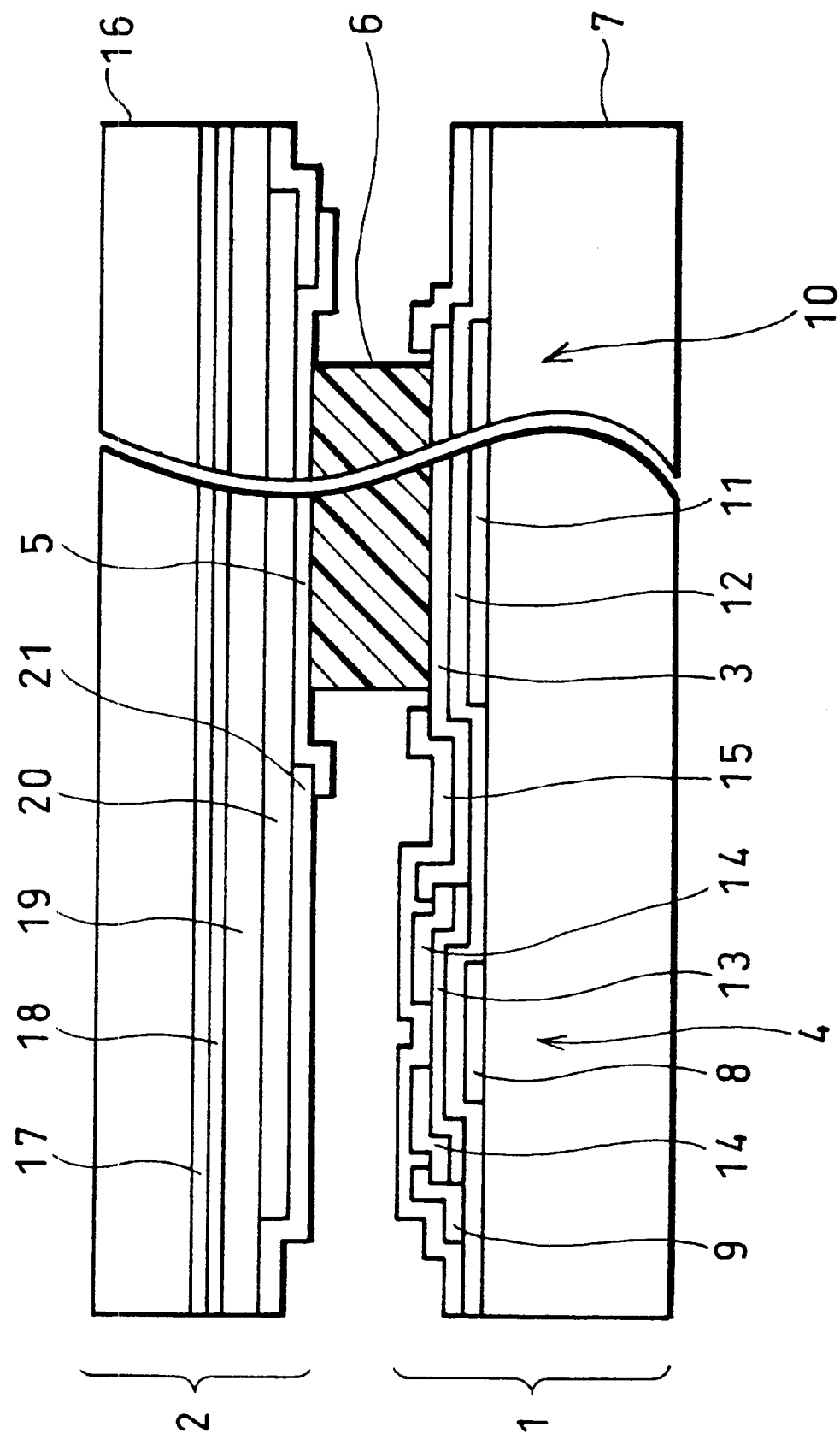
FIG. 2 is a cross-sectional view illustrating a structure of a part of the foregoing two-dimensional image detector corresponding to one pixel.

FIG. 2 is a cross-sectional view illustrating a part of the foregoing two-dimensional image detector corresponding one pixel. The arrangements of the active matrix substrate 1 and the counter substrate 2 are explained in detail below, with reference to FIG. 2.

The active matrix substrate 1 in accordance with the present embodiment may be prepared by the same process as that used for active matrix substrates prepared in the process of manufacturing liquid crystal display devices. Electrode wires in an XY lattice form (gate electrodes 8 and data electrodes 9), TFTs 4, charge storing capacitors (Cs), etc. are formed on the glass substrate 7.

The glass substrate 7 is formed with a no-alkali glass substrate 7 (for instance, #7059 or #1737 available from Corning Industries, Inc.), and is provided with the gate electrodes 8, made of metal films of Al (aluminum), Ta (tantalum), Mo (molybdenum), etc. The gate electrodes 8 are obtained by sputtering deposition of a film of the foregoing metal, approximately 4000 Å in thickness, followed by patterning in a desired shape. At this time, charge storing capacitor electrodes (Cs electrodes) 11 composing charge storing capacitors (Cs) 10 are also provided.

Subsequently, an insulating layer 12 approximately 3500 Å in thickness is provided by CVD (chemical vapor deposition) of $SiN_x$ (silicon nitride), $SiO_x$ (silicon oxide), etc. The insulating film 12 functions as a gate insulating film and as a dielectric layer between the electrodes of the charge storage capacitor (Cs) 10. Incidentally, for the insulating film 12, an anodic oxidation film provided by anodizing the gate electrode 8 and the charge storing capacitor electrode (Cs electrode) 11 may be used along with the $SiN_x$, $SiO_x$, etc.

Next, an a-Si film (i layer) 13, which forms a channel section of the TFT 4, and an a-Si film ($n^+$ layer) 14, which provides contact of the foregoing a-Si film (i layer) 13 with the data electrode 9 and a drain electrode to be described later, are provided with thicknesses of about 1000 Å and about 400 Å, respectively, by CVD followed by patterning in a desired shape.

Next, the data electrode 9 and the pixel electrode 3 also serving as a drain electrode, which are formed with a film of a metal such as Ta, Al, Ti (titanium), etc., are provided. The foregoing data electrode 9 and pixel electrode 3 are obtained by sputtering deposition of the metal film, followed by patterning in a desired shape. Incidentally, the pixel electrode 3 and the drain electrode may be provided separately, and it is also possible to use a transparent electrode of ITO (indium tin oxide), etc. for the pixel electrode 3.

Then, in order to insulate and protect all areas other than the opening of the pixel electrode 3, an insulating protective film 15 is provided. The insulating protective film 15 is obtained by forming an insulating film of $SiN_x$, $SiO_x$, etc. approximately 6000 Å in thickness by CVD, followed by patterning in a desired shape. Instead of an inorganic insulating film, the insulating protective film 15 may be an organic film of acrylic, polyimide, etc.

In this way, the active matrix substrate 1 is completed. Incidentally, in the present embodiment, the TFTs 4 of the active matrix substrate 1 are amorphus silicon (a-Si) TFT elements having an inverse-staggered structure, but there is no limitation to this; it is also possible to use polysilicon (p-Si), and to use a staggered structure.

The counter substrate 2, on the other hand, includes a supporting substrate (substrate) 16 made of a material having transmissivity for X-rays, for instance, glass, or ceramics. Herein used is a substrate of glass, which has superior transmissivity for both X-rays and visible light, with a thickness of 0.7 mm to 1.1 mm. This type of glass substrate transmits almost all X-rays of 40 keV to 100 keV.

Next, an upper electrode (first electrode layer) 17 made of a metal such as ITO or Au (gold) is provided over the substantial entirety of one surface of the supporting substrate 16. However, when the two-dimensional image detector of the present embodiment is used for detecting images in visible light, it is necessary to use as the upper electrode 17 an ITO electrode, which has transmissivity for visible light.

Next, a p-type semiconductor layer made of, for instance, ZnTe, is provided as a first charge blocking layer 18 over the substantial entirety of the surface of the upper electrode 17. Further, thereon, a semiconductor layer 19 is formed with an i-type semiconductor material having photoconductivity. This semiconductor layer 19 having photoconductivity is provided by depositing a polycrystalline film made of CdTe, CdZnTe, etc. to a thickness of several hundreds of $\mu$m by the MOCVD (metal organic chemical vapor deposition) method. Incidentally, instead of the MOCVD method, a polycrystalline film of CdTe, CdZnTe, etc. may be formed by another method such as the close-spaced sublimation method or the paste burning method.

Here, random projections and recesses are produced on the surface of the semiconductor layer 19. Accordingly, next, a flattening treatment is applied to the surface of the semiconductor layer 19 having the projections and recesses. The flattening treatment will be described later in detail.

Subsequently, after an n-type semiconductor layer made of, for instance, CdS is formed as a second charge blocking layer (charge blocking layer) 20, a connection electrode (electrode layer, second electrode layer) 5 is formed with ITO, Au, Pt (platinum), etc. Here, the second charge blocking layer 20 and the connection electrode 5 are patterned so that each portion corresponding to one pixel is independent and separate from another, to prevent leakage between adjacent pixels. The connection electrode 5 is provided to collect charges at each pixel independently. In the figure, 21 is an insulating protective film.

The counter substrate 2 arranged as described above has a structure in which the i-type semiconductor layer 19 is provided between the first charge blocking layer (p-type semiconductor layer) 18 and the second charge blocking layer (n-type semiconductor layer) 20, that is, a blocking photodiode structure of the PIN junction type. Therefore, dark current upon non-projection of X-rays is reduced, while sensor characteristics excelling in the S/N ratio (sensitivity to X-rays) are exhibited.

Incidentally, the presence of the first and second charge blocking layers 18 and 20 and their material and structure are not particularly limited, and any may be chosen as required from among various materials in various combinations applicable. For example, the Schottky junction, the MIS (metal insulator semiconductor) junction, etc. may be applicable, instead of the PIN junction. Moreover, according to characteristics required, one of the first and second charge blocking layers 18 and 20, or the both, can be omitted.

The conductive connection material 6 is provided on either the active matrix substrate 1 fabricated through the foregoing process or the counter substrate 2. The conductive connection material 6 is arranged in a pattern such that one portion thereof corresponding to one pixel is independent and separate from another. By using as the conductive connection material 6 a resin material that is a photoconductive resin with a conductive pigment dispersed therein, the pattern formation by the photolithography technique is made possible.

Then, by assembling the substrates 1 and 2 and applying the thermocompression bonding thereto, so that the substrates 1 and 2 are electrically and mechanically connected, the two-dimensional image detector is completed. As the conductive connection material 6 for connecting the substrates 1 and 2, a conductive adhesive that can be patterned by the screen printing, or alternatively solder bumps, may be utilized in the place of the foregoing photosensitive resin.

As the foregoing conductive connection material 6, an adhesive (binder resin) with conductive particles dispersed therein, that is, the so-called anisotropic conductive adhesive, can be used. In the case of the anisotropic conductive adhesive, it has conductive anisotropy itself. Therefore, without patterning according to pixels separately provided from each other, it is possible to obtain conductivity between the pixel electrodes 3 on the active matrix substrate 1 and the connection electrode 5 on the counter substrate 2, while keeping insulation between adjacent pixels.

The two-dimensional image detector thus obtained is composed of (i) the active matrix substrate 1 equipped with the electrode wires (gate electrodes 8 and data electrodes 9) in a lattice form, the plurality of TFTs 4 provided at lattice points, and the plurality of pixel electrodes 3 respectively connected with the TFTs 4, and (ii) the counter substrate 2 provided with the semiconductor layer 19 having photoconductivity over a substantial entirety of one surface thereof. The active matrix substrate 1 and the counter substrate 2 are electrically and mechanically connected with each other.

Therefore, in the case where a semiconductor material that requires a film formation temperature not lower than a heat resistance critical temperature of the active matrix substrate 1, the semiconductor material is not provided directly on the active matrix substrate 1, and it is possible to use such a semiconductor material as a materials of the semiconductor layer 19 of the two-dimensional image detector.

Consequently, polycrystalline CdTe or CdZnTe can be used as the material for the semiconductor layer 19 so as to be provided at a film formation temperature of not lower than 400° C. by the MOCVD method, the close-spaced sublimation method, or the paste burning method. This provides enhancement of sensitivity to X-rays as compared with a two-dimensional image detector utilizing a-Se in the semiconductor layer 19, thereby enabling to obtain image data corresponding to animated drawings, that is, image data at 33 msec/frame.

The following description will explain a method for flattening the surface of the semiconductor layer 19 provided on the counter substrate 2 of the aforementioned two-dimensional image detector.

As described above, the polycrystalline semiconductor layer 19 made of CdTe, or CdZnTe can be formed by the MOCVD method, the close-spaced sublimation method, or the paste burning method. In the case where the foregoing semiconductor layer 19 is formed to a thickness of several hundreds of μm, however, there occurs a phenomenon in which projections and recesses are produced at random all over the entirety of the film surface.

Figure 3:
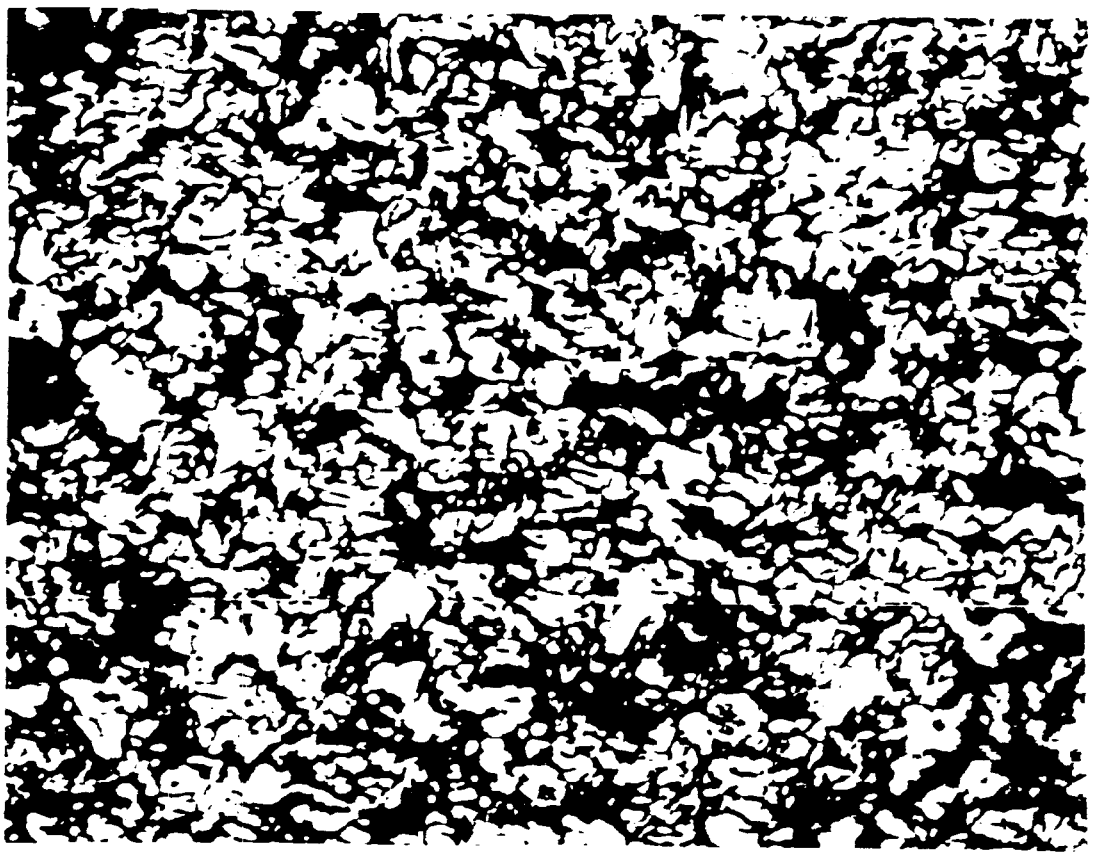
FIG. 3 is a photographical drawing showing projections and recesses on a CdTe polycrystalline film surface formed by the MOCVD method.

For example, FIG. 3 shows a microscopic photograph showing projections and recesses on a surface of a CdTe polycrystalline film formed through the MOCVD method. In the photograph, it is recognized that CdTe crystalline particles with a diameter of several μm each are present at random on the film surface. In other words, projections and recesses that have differences in height of several μm are present on the film surface. Incidentally, the MOCVD method is herein applied as the film forming method, but this phenomenon is observed likewise in the case where a method other than the MOCVD method, namely the close-spaced sublimation method, or the paste burning method, is applied to form a film of CdTe or CdZnTe.

Figure 4:
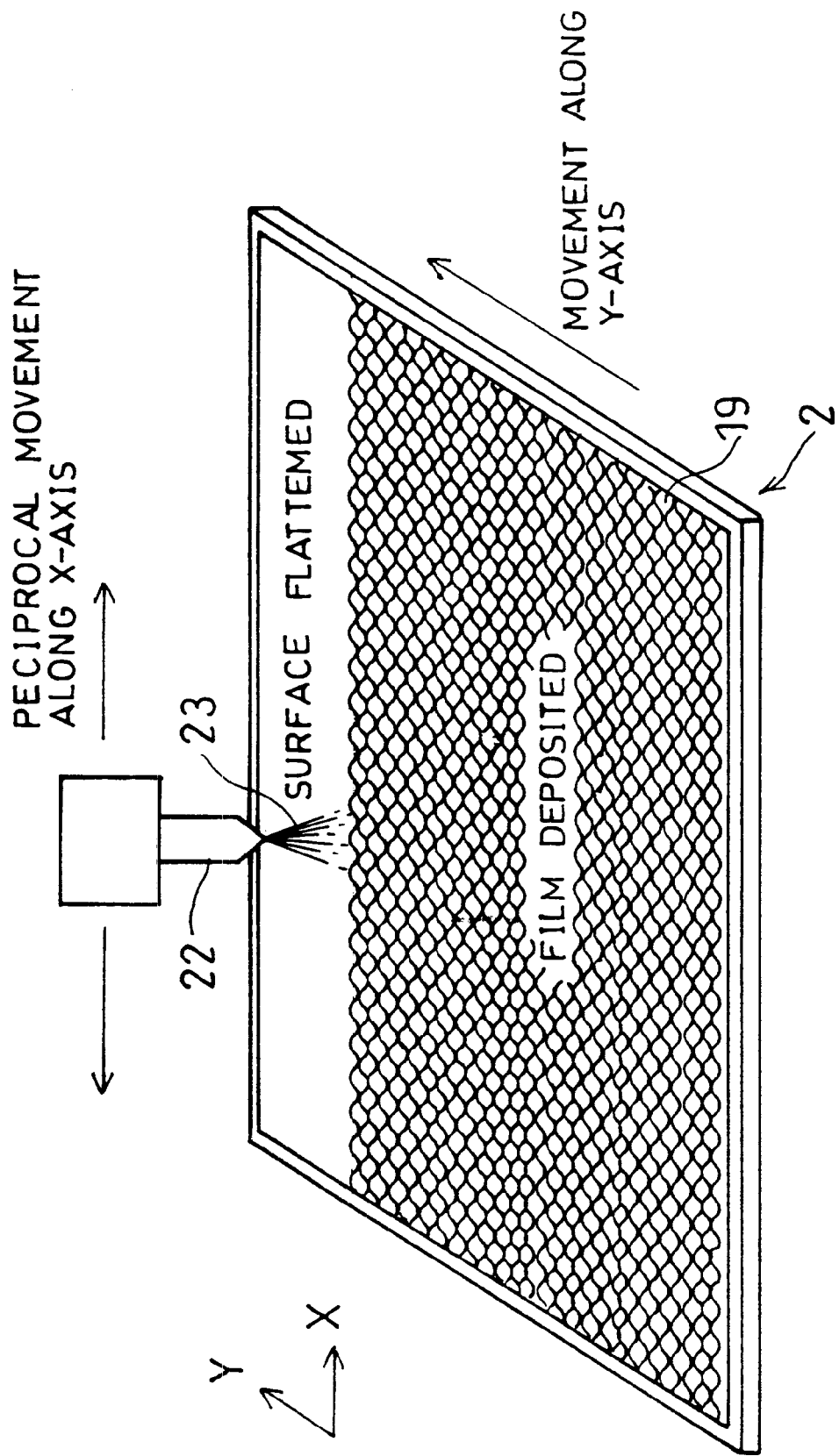
FIG. 4 is a view for explaining a method for flattening the semiconductor layer surface.

In the present embodiment, therefore, as shown in FIG. 4, flattening of the surface of the semiconductor layer 19 after formation is attempted by spraying the surface with ceramic particles (abrasive grain) 23. As shown in the figure, the counter substrate 2 having the semiconductor layer 19 provided over a substantial entirety of one surface thereof is sprayed with the ceramic particles 23 by means of an abrasive grain jet nozzle 22. The abrasive grain jet nozzle 22 repeatedly makes a high-speed reciprocating motion in an X direction at constant cycles while jetting the ceramic particles 23. Furthermore, by moving the counter substrate 2 in a Y direction as shown in the figure, the entirety of the semiconductor layer 19 surface is subjected to the flattening treatment.

The foregoing flattening method applied to the semiconductor layer 19 surface is very simple since only spraying the surface of the semiconductor layer 19 with the ceramic particles is carried out, and hence has an advantage that it can be also applied in the case where the semiconductor layer 19 is provided on a large-area substrate.

Incidentally, the "ceramic particles 23" herein described generally refer to particles made of solid substances other than those made of metals. Other than $Al_2O_3$, various abrasive particles such as SiC, $B_4C$, BN, and diamond are applicable. It is also possible to use a mixture in which several types of abrasive particles are blended. Further, a work may be sprayed with the ceramic particles 23 in a state of being dispersed in a liquid such as water. In the present embodiment, since the differences in height between projections and recesses on the film surface of the semiconductor layer 19 are more or less several μm, the diameter of the ceramic particles 23 is desirably set to #1000 to #4000. Note that # (mesh) is a unit of a size of an aperture of a sieve, which expresses the number of apertures per one inch in length.

Furthermore, in the case where peculiar projections or macroscopic undulations are present on the surface of the semiconductor layer 19, the semiconductor layer 19 is preferably planed roughly by another abrading method beforehand, and is then subjected to the flattening treatment by the aforementioned flattening method.

Incidentally, as a method for abrading the semiconductor layer 19, a conventional common abrading method is applicable instead of the foregoing method of spraying the semiconductor layer 19 with the ceramic particles 23. More specifically, it is possible to abrade the surface of the semiconductor layer 19 by means of an abrasive stone, wrapping sheet, an abrasive liquid with abrasive grains dispersed therein, a sheet of fabric having random projections, etc. The application of such a conventional abrading method enables to completely flatten the surface of the semiconductor layer 19 even with peculiar projections or macroscopic undulations.

Furthermore, the use of the CMP (chemical mechanical polish) technique in combination with a chemical abrasive liquid enables to flatten the surface of the semiconductor layer 19 while minimizing stress applied to the semiconductor layer 19, and ultimately, to flatten the surface to such an extent as the flatness of a semiconductor wafer.

The following description will explain three effects to be achieved by the foregoing flattening treatment applied to the surface of the semiconductor layer 19 of the two-dimensional image detector.

First of all, leakage comes to hardly occur to an interface between the semiconductor layer 19 and the second charge blocking layer 20 in the counter substrate 2 by introducing the surface flattening treatment with respect to the semiconductor layer 19. Conventionally, leakage in an order of $nA/mm^2$ occasionally occurs because of projections and recesses on the surface of the semiconductor layer 19. The surface flattening treatment introduced to flatten the surface of the semiconductor layer 19, however, provides a flat surface thereof, thereby stably reducing the leakage current to an order of several tens of $pA/mm^2$. Consequently, it is possible to drastically improve the S/N ratio of the sensor characteristics and the reliability.

Secondly, in the case where the conductive material (for example, photoconductive resin) patterned according to pixels is used as the conductive connection material 6 in the process of assembling the active matrix substrate 1 and the counter substrate 2 with the conductive connection material 6, bubbles come to be hardly caught between connection electrode 5 and the conductive connection material 6. This results in that connection defects and degradation of reliability can be suppressed. Furthermore, the pattern of the conductive connection material 6 according to the pixels does not vary, thereby resulting in that portions of the conductive connection material 6 corresponding to adjacent pixels are not brought into contact with each other. Furthermore, since the connection electrode 5 excels in flatness, the same effect is achieved in the case where an anisotropic conductive adhesive is used as the conductive connection material 6.

Thirdly, in the case where the connection electrode 5 as an electrode layer collecting charges or the second charge blocking layer 20 on the semiconductor layer 19 is patterned according to the pixels independent and separate from each other, the connection electrode 5 or the charge blocking layer 20 is made flat since the semiconductor layer 19 is flat. Consequently, the micromachining process can be easily applied onto the connection electrode 5.

As described above, by introducing the flattening treatment with respect to the semiconductor layer 19 into the two-dimensional image detector fabrication process, performance and reliability of the two-dimensional image detector fabricated can be enhanced.

[Second Embodiment]

Figure 5:
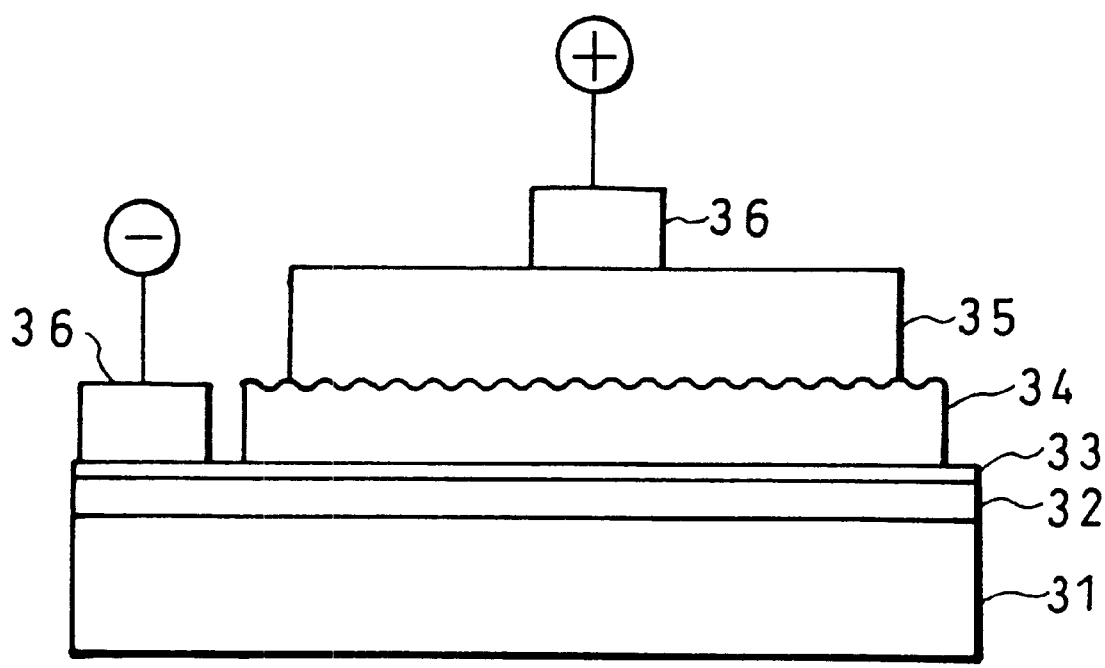
FIG. 5 is a cross-sectional view schematically illustrating an arrangement of a solar battery utilizing CdS/CdTe junction in accordance with a second embodiment of the present invention.
Figure 6:
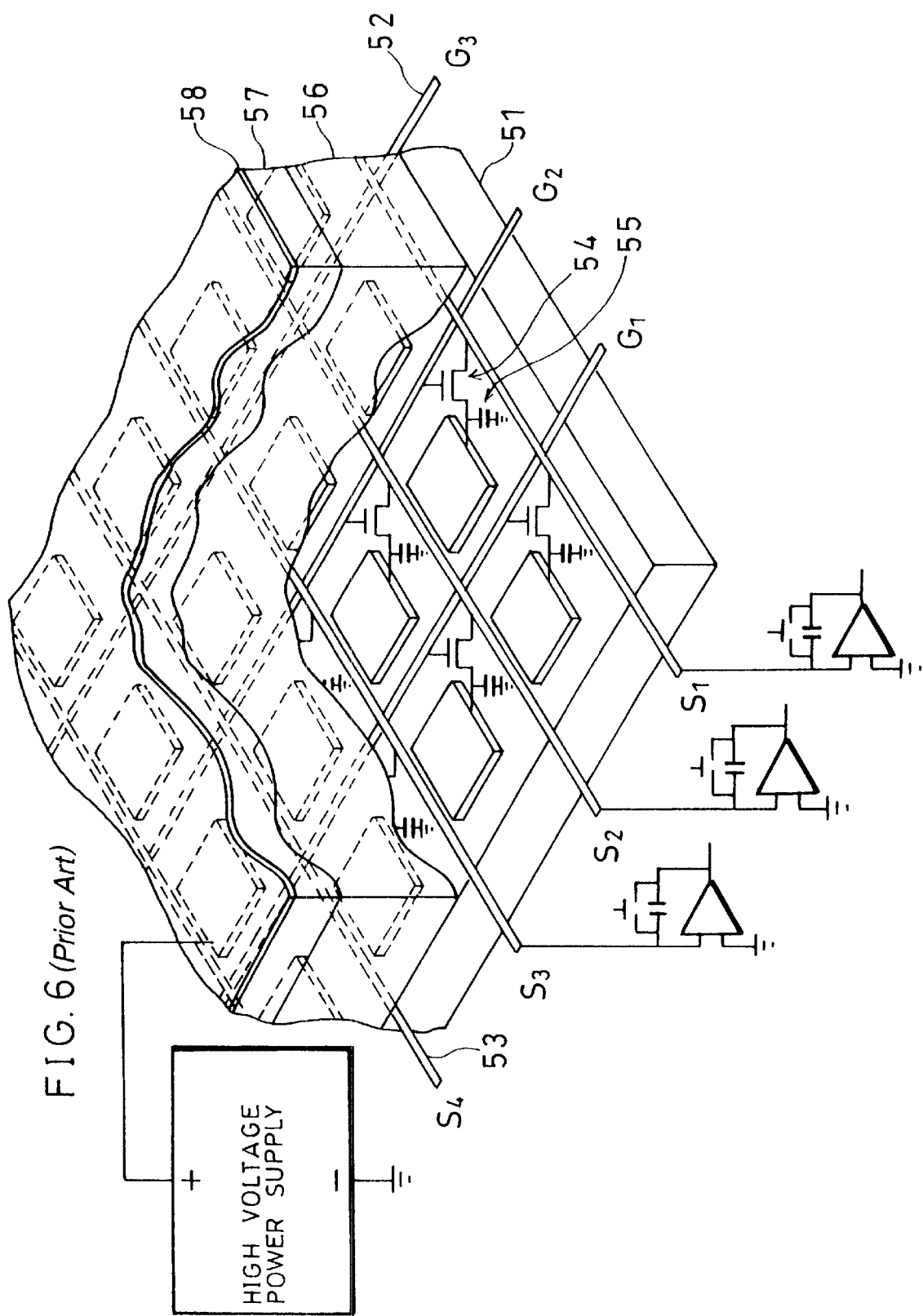
FIG. 6 is a perspective view schematically illustrating an arrangement of a conventional two-dimensional image detector.
Figure 7:
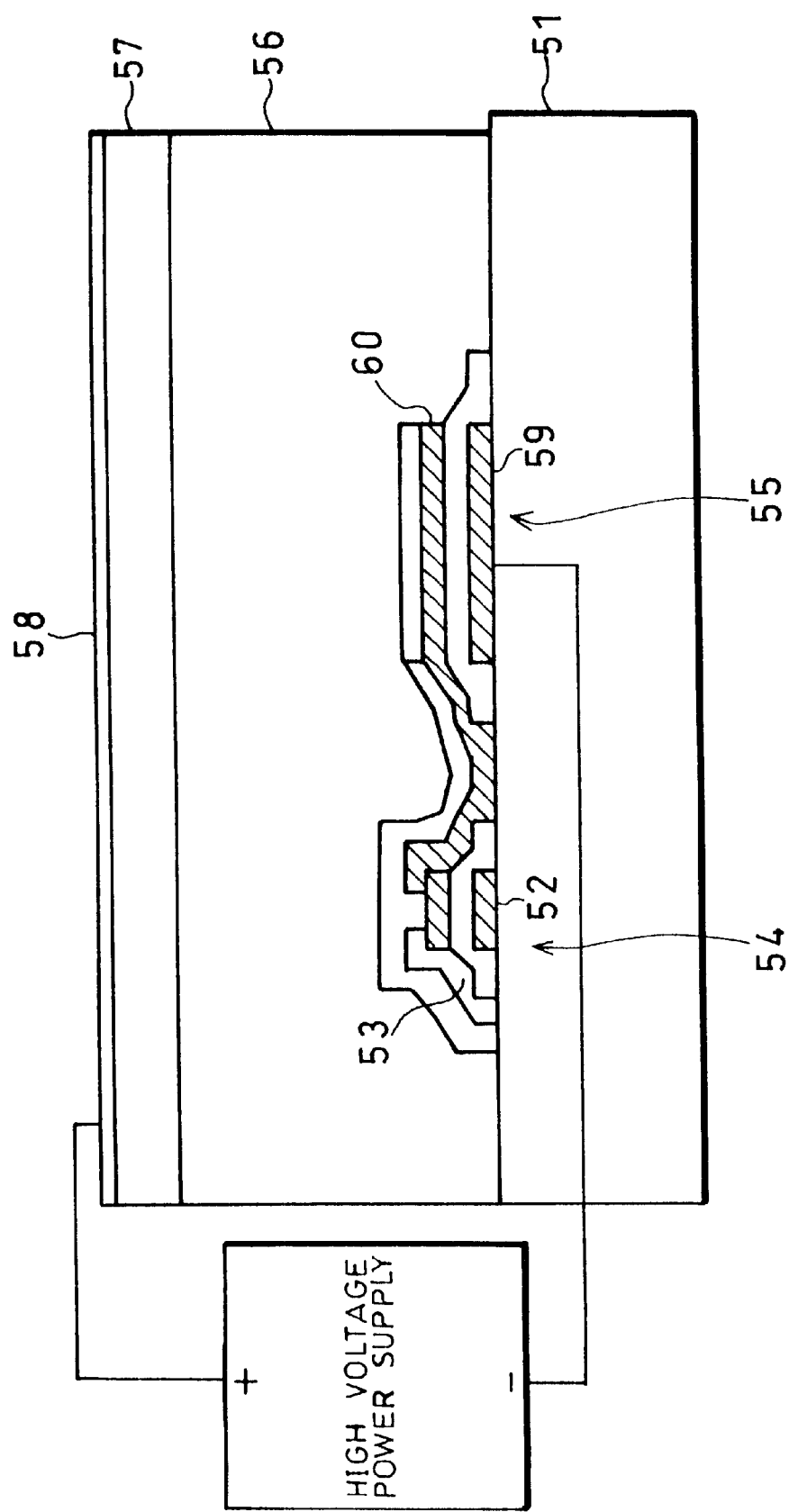
FIG. 7 is a cross-sectional view schematically illustrating a structure of a part of the foregoing two-dimensional image detector corresponding to one pixel.
Figure 8:
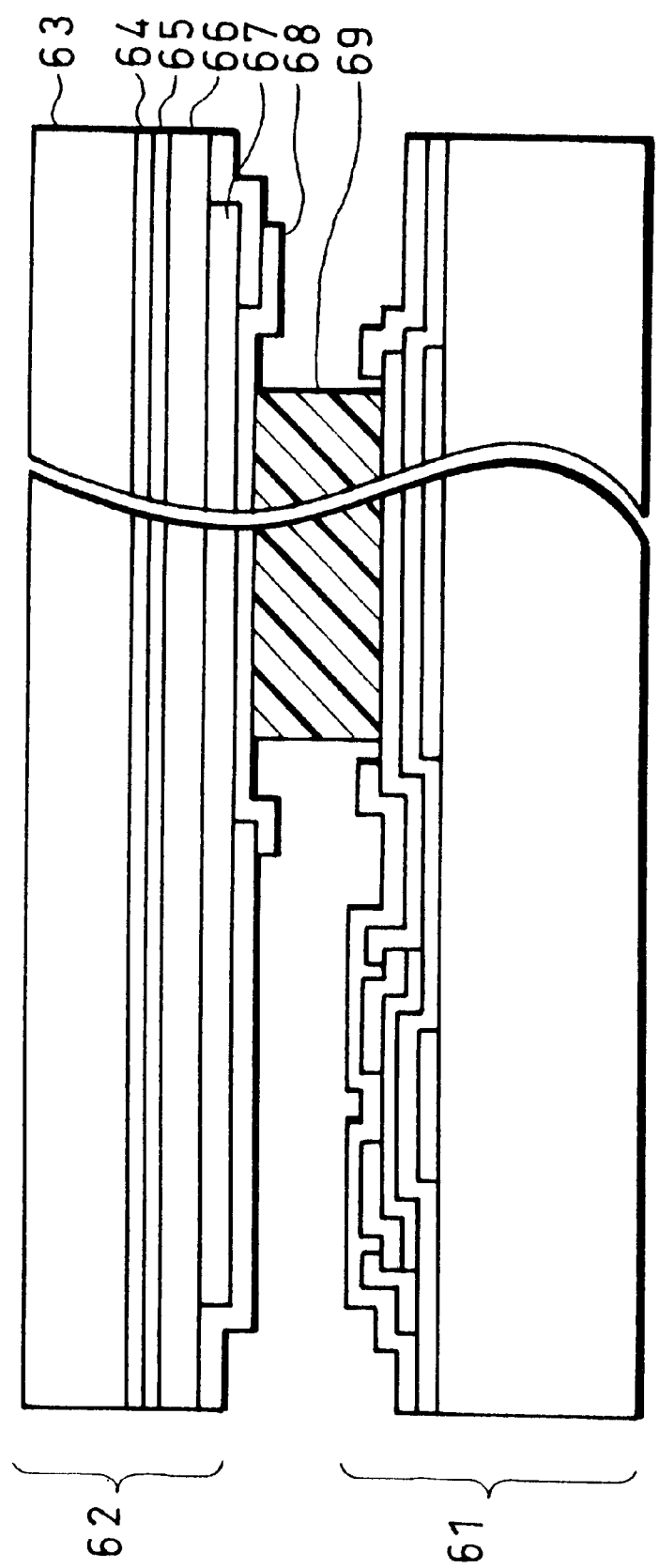
FIG. 8 is a cross-sectional view schematically illustrating a structure of a part of another conventional two-dimensional image detector corresponding to one pixel.

The following description will explain a second embodiment of the present invention while referring to FIG. 5. Incidentally, the members having the same structure (function) as those in the first embodiment will be designated by the same reference numerals and their description will be omitted.

The method for flattening the semiconductor layer 19 described in conjunction with the first embodiment can be advantageously applied to a process of fabricating a device other than the two-dimensional image detector. The following description will explain, as one of the examples, a case in which the foregoing flattening treatment applied to the semiconductor layer 19 is applied to the fabrication of solar batteries. FIG. 5 is a cross-sectional view illustrating an arrangement of a solar battery in which CdS/CdTe junction is utilized, and a solar battery fabrication process is explained with reference to FIG. 5.

First of all, ITO or $SnO_2$ as a transparent electrode 32 is provided on a glass substrate (for instance, #1737 available from Corning Industries, Inc.) (substrate) 31. A CdS thin film 33 is then provided to a thickness of approximately several $\mu$m on the foregoing transparent electrode 32 by the MOCVD method. Further, a CdTe film (semiconductor film) 34 is formed thereon to a thickness of approximately 10 $\mu$m by the close-spaced sublimation method. Thereafter, by applying $CdCl_2$ aqueous solution thereon and by applying heat treatment, CdTe crystals grow so as to have a diameter of approximately several $\mu$m.

Here, on the surface of the CdTe film 34, affected by the CdTe crystal particles, projections and recesses in a size substantially corresponding to the diameter of the CdTe crystal particle are occasionally produced on the surface of the CdTe film 34. In other words, the surface of the CdTe film 34 have projections and recesses whose difference in height is approximately several $\mu$m. Therefore, a flattening treatment is applied to the surface of the CdTe film 34 thus formed. The method of the flattening treatment is basically identical to that described above in conjunction with the first embodiment. Namely, the surface of the CdTe film 34 is sprayed with the ceramic particles 23, so that the surface of the CdTe film 34 is flattened. Incidentally, the diameter of the ceramic particles 23 is preferably in the range shown in the description of the first embodiment.

A C electrode (electrode layer) 35 is then formed by screen-printing and burning carbon paste on the surface of the CdTe film 34. Further, an Ag electrode (electrode layer) 36 is formed by screen-printing and burning Ag paste on the surfaces of the CdTe film 34 and the C electrode 35. These C electrode 35 and Ag electrode 36 function as an upper electrode.

Through the foregoing process, a basic structure of the solar battery is completed. Thus, by the method in accordance with the present embodiment, a solar battery can be realized in which a surface of a CdTe film 34 is flattened while a diameter of polycrystalline particles of the CdTe film 34 is let to remain approximately several $\mu$m. Therefore, printing failures stemming from projections and recesses on the surface of the CdTe film 34 can be reduced even in the case where a C electrode 35 and an Ag electrode 36 as an upper electrode are formed by paste printing or the like.

Furthermore, the foregoing flattening treatment is suitably applied to a large-area semiconductor film, and hence, it is applicable to fabrication of solar batteries on a glass substrate with a large-area surface, without causing any problem. The flattening treatment applicable to the CdTe film 34 is, however, not limited to this, and a conventional abrading method may be applied like in the first embodiment.

Incidentally, the method in accordance with the present invention for fabricating the light/radiations detection element or the two-dimensional image detector is not exclusively applicable to the devices explained above in conjunction with the first and second embodiments. Needless to say, the flattening treatment as a method for flattening a surface of a semiconductor film having projections and recesses in the $\mu$m order after formation of the film is applicable to another fabrication process of a light/radiations detection element or a two-dimensional image detector that utilizes semiconductor films. For example, it is applicable to a fabrication process of an infrared sensor.

The semiconductor film material to which the foregoing treatment is applicable is not limited to the above-described CdTe, CdZnTe, etc., either. The treatment can be widely applied to a II–IV group chemical compound semiconductor, a III–V group chemical compound semiconductor, a V-group semiconductor, and the like, and it is particularly effective in the case where a polycrystalline semiconductor film surface having projections and recesses has to be flattened.

The following description will summarize characteristics of a method for fabricating a detection element in accordance with the present invention and a method for fabricating a two-dimensional image detector in accordance with the present invention.

A method for fabricating a detection element in accordance with the present invention includes the steps of (a) forming a semiconductor film having photoconductivity on a substrate, (b) flattening a surface of the semiconductor film, and (c) forming at least either a charge blocking layer or an electrode layer on the semiconductor film.

Furthermore, the foregoing detection element may be a light detection element in which the foregoing semiconductor film exhibits photoconductivity with respect to at least either visible light or infrared light projected to the foregoing semiconductor film, or may be a radiations detection element in which the foregoing semiconductor film exhibits photoconductivity with respect to radiations projected thereto.

The foregoing method enables to apply micromachining process for forming the charge blocking layer or the second electrode layer on the semiconductor film, and further, to realize excellent connection of the semiconductor film with the charge blocking layer or the second electrode layer.

Furthermore, the method for fabricating a detection element in accordance with the present invention is preferably arranged so that a plurality of the electrode layers are arrayed in a two-dimensional matrix form. By this method, it is possible to fabricate a light/radiations detection element applicable to a two-dimensional image detector.

Furthermore, the method for fabricating a detection element in accordance with the present invention is preferably arranged so that in the flattening step, the surface of the semiconductor film is sprayed with ceramic particles. By using the method, it is possible to realize flatness of a surface of a semiconductor film formed on a large-area substrate.

Furthermore, the method for fabricating a detection element in accordance with the present invention may be arranged so that in the flattening step, the surface of the semiconductor film is abraded.

The foregoing method enables to completely flatten the surface of the semiconductor film even with peculiar projections or macroscopic undulations. Furthermore, the use of the CMP technique in combination with a chemical abrasive liquid enables to flatten the surface of the semiconductor film while minimizing stress applied to the semiconductor film.

By so doing, the surface of the semiconductor film can be completely flattened, irrespective of conditions of projections and recesses on the surface of the semiconductor film.

Furthermore, the method for fabricating a detection element in accordance with the present invention may be arranged so that the semiconductor film is a polycrystalline film made of either CdTe or CdZnTe.

According to the foregoing method, the semiconductor film is composed of a polycrystalline film made of CdTe or CdZnTe excelling in sensitivity with respect to radiations such as X-rays. Therefore, it is possible to provide a radiations detection element excelling in sensitivity with respect to radiations such as X-rays, or a light detection element (for example, a solar battery) with high efficiency.

A method in accordance with the present invention for fabricating a two-dimensional image detector as a device in which the foregoing detection element is applied, which is a two-dimensional image detector composed of (1) an active matrix substrate having (i) a pixel array layer including electrode wires arranged in a lattice form, (ii) switching elements provided at lattice points of the electrode wires, and (iii) charge storing capacitors including pixel electrodes connected with the electrode wires through the switching elements, (2) a counter substrate having a support substrate on which a first electrode layer and a semiconductor film having photoconductivity are provided in the stated order, and (3) a conductive connection material electrically connecting the active matrix substrate and the counter substrate in a state in which the pixel array layer of the active matrix substrate and the semiconductor film of the counter substrate are vis-a-vis each other, and the method is characterized by including the steps of (a) forming the first electrode layer on the support substrate, (b) forming the semiconductor layer on the first electrode layer, (c) flattening a surface of the semiconductor film, and (d) forming either a charge blocking layer or a second electrode layer on the semiconductor film.

The foregoing method enables a micromachining process for forming a charge blocking layer or a second electrode layer on the semiconductor film, and further, to provide a two-dimensional image detector in which excellent connection of the semiconductor film with the charge blocking layer or the second electrode layer is realized.

Furthermore, the method for fabricating a two-dimensional image detector in accordance with the present invention is preferably arranged so that in the flattening step, the surface of the semiconductor film is sprayed with ceramic particles. By using the method, it is possible to realize flatness of a surface of a semiconductor film in the two-dimensional image detector even in the case where the semiconductor film is formed on a large-area substrate.

Furthermore, the method for fabricating a detection element in accordance with the present invention may be arranged so that in the flattening step, the surface of the semiconductor film is abraded.

The foregoing method improves flatness of the surface of the semiconductor film by abrading the surface of the semiconductor film. Therefore, the foregoing method enables to completely flatten the surface of the semiconductor film even with peculiar projections or macroscopic undulations. Furthermore, the use of the CMP technique in combination with a chemical abrasive liquid enables to flatten the surface of the semiconductor film while minimizing stress applied to the semiconductor film.

By so doing, the surface of the semiconductor film composing the two-dimensional image detector can be completely flattened, irrespective of conditions of the surface of the semiconductor film.

Furthermore, the method for fabricating a two-dimensional image detector in accordance with the present invention may be arranged so that the semiconductor film is a polycrystalline film made of either CdTe or CdZnTe.

According to the foregoing method, the semiconductor film is composed of a polycrystalline film made of CdTe or CdZnTe excelling in sensitivity with respect to radiations such as X-rays.

Therefore, it is possible to provide a two-dimensional image detector excelling in sensitivity with respect to radiations such as X-rays.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Method for fabricating a detection element, comprising the steps of:
    forming a semiconductor film having photoconductivity on a substrate;
    flattening a surface of the semiconductor film; and
    forming at least either a charge blocking layer or an electrode layer on the semiconductor film, wherein:
    in said flattening step, the surface of the semiconductor film is sprayed with ceramic particles.

2. The method as set forth in claim 1, wherein:
    the semi conductor film exhibits photoconductivity with respect to at least either visual light or infrared light projected thereto.

3. The method as set forth in claim 1, wherein:
    the semiconductor film exhibits photoconductivity with respect to radiations projected thereto.

4. The method as set forth in claim 1, wherein:
    a plurality of the electrode layers are arrayed in a two-dimensional matrix form.

5. The method as set forth in claim 1, wherein:
    the ceramic particles have a diameter of not less than #1000 and not more than #4000.

6. The method as set forth in claim 2, wherein:
    the ceramic particles have a diameter of not less than #1000 and not more than #4000.

7. The method as set forth in claim 3, wherein:
    the ceramic particles have a diameter of not less than #1000 and not more than #4000.

8. The method as set forth in claim 1, wherein:
    the semiconductor film is a polycrystalline film made of either CdTe or CdZnTe.

9. The method as set forth in claim 2, wherein:
    the semi conductor film is a polycrystalline film made of either CdTe or CdZnTe.

10. The method as set forth in claim 3, wherein:
    the semiconductor film is a polycrystalline film made of either CdTe or CdZnTe.

11. A method for fabricating a two-dimensional image detector composed of an active matrix substrate, a counter substrate, and a conductive connection material,
    said active matrix substrate having:
        a pixel array layer including electrode wires arranged in a lattice form; switching elements provided at lattice points of the electrode wires; and charge storing capacitors including pixel electrodes connected with the electrode wires through the switching elements, said counter substrate having a support substrate on which a first electrode layer and a semiconductor film having photoconductivity are provided in the stated order, and said conductive connection material electrically connecting said active matrix substrate and said counter substrate in a state in which the pixel array layer of said active matrix substrate and the semiconductor film of said counter substrate are vis-a-vis each other, said method, comprising the steps of:

forming the first electrode layer on the support substrate;

forming the semiconductor layer on the first electrode layer;

flattening a surface of the semiconductor film; and forming either a charge blocking layer or a second electrode layer on the semiconductor film.

12. The method as set forth in claim 11, wherein:
in said flattening step, the surface of the semiconductor film is sprayed with ceramic particles.

13. The method as set forth in claim 12, wherein:
the ceramic particles have a diameter of not less than #1000 and not more than #4000.

14. The method as set forth in claim 11, wherein:
in said flattening step, the surface of the semiconductor film is abraded.

15. The method as set forth in claim 11, wherein:
the semiconductor film is a polycrystalline film made of either CdTe or CdZnTe.

16. Method for fabricating a detection element, comprising the steps of:

forming a semiconductor film having photoconductivity on a substrate;

flattening a surface of the semiconductor film; and forming at least either a charge blocking layer or an electrode layer on the semiconductor film, wherein:

in said flattening step, the surface of the semiconductor film is abraded.

17. The method as set forth in claim 16, wherein:
the semiconductor film exhibits photoconductivity with respect to at least either visual light or infrared light projected thereto.

18. The method as set forth in claim 16, wherein:
the semiconductor film exhibits photoconductivity with respect to radiations projected thereto.

19. The method as set forth in claim 16, wherein:
a plurality of the electrode layers are arrayed in a two-dimensional matrix form.

20. The method as set forth in claim 16, wherein:
the semiconductor film is a polycrystalline film made of either CdTe or CdZnTe.

21. The method as set forth in claim 17, wherein:
the semiconductor film is a polycrystalline film made of either CdTe or CdZnTe.

22. The method as set forth in claim 18, wherein:
the semiconductor film is a polycrystalline film made of either CdTe or CdZnTe.

23. A method for fabricating a detection element, comprising the steps of:

forming a polycrystalline semiconductor film having photoconductivity on a glass or ceramic substrate; and flattening a surface of the polycrystalline semiconductor film, wherein:

in said flattening step, the surface of the polycrystalline semiconductor film is sprayed with ceramic particles.

24. The method as set forth in claim 23, wherein:
the polycrystalline semiconductor film is made of either CdTe or CdZnTe.

25. A method for fabricating a detection element, comprising the steps of:

forming a polycrystalline semiconductor film having photoconductivity on a glass or ceramic substrate; and flattening a surface of the polycrystalline semiconductor film, wherein:

in said flattening step, the surface of the polycrystalline semiconductor film is abraded.

26. A method for fabricating a two-dimensional image detector composed of an active matrix substrate, a counter substrate, and a conductive connection material, said active matrix substrate having electrode wires arranged in a lattice form; switching elements provided near lattice points of the electrode wires; and a pixel array layer including charge storing capacitors connected with the electrode wires through the switching elements, said counter substrate having a support substrate on which a first electrode layer and a semiconductor film having photoconductivity are provided in the stated order, and said conductive connection material electrically connecting said active matrix substrate and said counter substrate in a state in which the pixel array layer of said active matrix substrate and the semiconductor film of said counter substrate are vis-a-vis each other, said method, comprising the steps of:

forming the first electrode layer on the support substrate;

forming a polycrystalline semiconductor film as the semiconductor film having photoconductivity on the first electrode layer; and flattening a surface of the polycrystalline semiconductor film.

27. The method as set forth in claim 26, wherein:
the support substrate is made of either glass or ceramic.

28. The method as set forth in claim 26, wherein:
the polycrystalline semiconductor film is made of either CdTe or CdZnTe.

29. The method as set forth in claim 26, Wherein:
in said flattening step, the surface of the polycrystalline semiconductor film is sprayed with ceramic particles.

30. The method as set forth in claim 26, wherein:
in said flattening step, the surface of the polycrystalline semiconductor film is abraded.

31. The method as set forth in claim 25, wherein:
the polycrystalline semiconductor film is made of either CdTe or CdZnTe.

* * * * *